United States Patent
Mollart et al.

(10) Patent No.: US 10,023,974 B2
(45) Date of Patent: Jul. 17, 2018

(54) SUBSTRATES FOR SEMICONDUCTOR DEVICES

(71) Applicant: RFHIC Corporation, Anyang-si (KR)

(72) Inventors: Timothy Mollart, Oxfordshire (GB); Quanzhong Jiang, Somerset (GB); Michael John Edwards, Somerset (GB); Duncan Allsopp, Somerset (GB); Christopher Rhys Bowen, Somerset (GB); Wang Nang Wang, Somerset (GB)

(*) Notice: Subject to any disclaimer, the term of this patent is extended or adjusted under 35 U.S.C. 154(b) by 33 days.

(21) Appl. No.: 14/648,256

(22) PCT Filed: Dec. 4, 2013

(86) PCT No.: PCT/EP2013/075557
§ 371 (c)(1),
(2) Date: May 28, 2015

(87) PCT Pub. No.: WO2014/095373
PCT Pub. Date: Jun. 26, 2014

(65) Prior Publication Data
US 2016/0186362 A1    Jun. 30, 2016

Related U.S. Application Data

(60) Provisional application No. 61/738,641, filed on Dec. 18, 2012.

(30) Foreign Application Priority Data

Dec. 18, 2012 (GB) .................................. 1222798.9
Jun. 5, 2013 (GB) .................................. 1310039.1

(51) Int. Cl.
H01L 21/02 (2006.01)
C30B 25/18 (2006.01)
(Continued)

(52) U.S. Cl.
CPC .............. *C30B 25/18* (2013.01); *C23C 16/27* (2013.01); *C30B 25/183* (2013.01); *C30B 29/04* (2013.01);
(Continued)

(58) Field of Classification Search
CPC ........... H01L 21/02376; H01L 21/0254; H01L 21/0521
See application file for complete search history.

(56) References Cited

U.S. PATENT DOCUMENTS 4,830,984 A    5/1989   Purdes et al.
5,272,104 A   12/1993   Schrantz et al.
(Continued)

FOREIGN PATENT DOCUMENTS

EP    0442304 A2   8/1991
EP    0551730 B1   4/1996
(Continued)

OTHER PUBLICATIONS

Edwards et al; Modelling Wafer Bow in Siliconpolycrstalline CVD Diamond Substrates for GaN-based devices; Sep. 9, 2010; p. 385502; vol. 43; Journal of Physics D: Applied Physics, Institute of Physics Publishing Limited, UK.
(Continued)

*Primary Examiner* — Michael Carter
(74) *Attorney, Agent, or Firm* — Patent Office of Dr. Chung Park

(57) ABSTRACT

A method of fabricating a composite semiconductor component comprising: (i) providing a bowed substrate comprising a wafer of synthetic diamond material having a thickness $t_d$, the bowed substrate being bowed by an amount B and comprising a convex face and a concave face; (ii) growing a layer of compound semiconductor material on the convex face of the bowed substrate via a chemical vapour
(Continued)

deposition technique at a growth temperature T to form a bowed composite semiconductor component comprising the layer of compound semiconductor material of thickness $t_{sc}$ on the convex face of the bowed substrate, the compound semiconductor material having a higher average thermal expansion coefficient than the synthetic diamond material between the growth temperature T and room temperature providing a thermal expansion mismatch $\Delta T_{ec}$; and (iii) cooling the bowed composite semiconductor component, wherein the layer of compound semiconductor material contracts more than the wafer of synthetic diamond material during cooling due to the thermal expansion mismatch $\Delta T_{ec}$, wherein B, $t_d$, $t_{sc}$, and $\Delta T_{ec}$ are selected such that the layer of compound semiconductor material contracts on cooling by an amount which off-sets bowing in the bowed substrate thus pulling the bowed composite semiconductor component into a flat configuration, the layer of compound semiconductor material having a tensile stress after cooling of less than 500 MPa.

5 Claims, 3 Drawing Sheets

(51) Int. Cl.

| | | |
|---|---|---|
| *C30B 29/36* | (2006.01) | |
| *C30B 29/40* | (2006.01) | |
| *C23C 16/27* | (2006.01) | |
| *C30B 29/04* | (2006.01) | |
| *H01L 23/373* | (2006.01) | |

(52) U.S. Cl.
CPC .............. *C30B 29/36* (2013.01); *C30B 29/40* (2013.01); *C30B 29/403* (2013.01); *C30B 29/406* (2013.01); *H01L 21/0245* (2013.01); *H01L 21/0254* (2013.01); *H01L 21/0262* (2013.01); *H01L 21/02376* (2013.01); *H01L 21/02428* (2013.01); *H01L 21/02433* (2013.01); *H01L 21/02513* (2013.01); *H01L 21/02521* (2013.01); *H01L 21/02538* (2013.01); *H01L 23/3732* (2013.01); *H01L 2924/0002* (2013.01)

(56) References Cited

U.S. PATENT DOCUMENTS

| | | | |
|---|---|---|---|
| 5,620,745 | A | 4/1997 | Simpson et al. |
| 6,214,427 | B1 | 4/2001 | Levinson et al. |
| 6,287,889 | B1 | 9/2001 | Miyake et al. |
| 7,595,507 | B2 | 9/2009 | Francis et al. |
| 7,695,564 | B1 | 4/2010 | Micovic et al. |
| 7,842,134 | B2 * | 11/2010 | Whitehead ........ H01L 21/02381 117/101 |
| 2003/0017626 | A1 | 1/2003 | Hilt et al. |
| 2003/0033974 | A1 | 2/2003 | Ueda et al. |
| 2006/0113545 | A1 | 6/2006 | Weber et al. |
| 2006/0211222 | A1 * | 9/2006 | Linares ................... C30B 23/02 438/480 |
| 2007/0023893 | A1 * | 2/2007 | Shin ...................... H01L 33/647 257/713 |
| 2009/0272984 | A1 | 11/2009 | Saxler et al. |
| 2010/0001293 | A1 | 1/2010 | Francis et al. |
| 2012/0068191 | A1 | 3/2012 | Marchand et al. |
| 2012/0187374 | A1 | 7/2012 | Lee et al. |

FOREIGN PATENT DOCUMENTS

| | | | |
|---|---|---|---|
| JP | 2008528420 | | 7/2008 |
| JP | 2000219597 | | 8/2008 |
| JP | 2010272781 | * | 12/2010 |
| JP | 2012109583 | | 7/2012 |
| WO | 2005/074013 A2 | | 8/2005 |
| WO | 2005/122284 A2 | | 12/2005 |
| WO | 2006081348 | | 8/2006 |
| WO | 2006/100559 A1 | | 9/2006 |

OTHER PUBLICATIONS

UKIPO Combined Search and Examination Report dated May 27, 2014 for GB1321371.5.
PCT International Search Report dated Mar. 31, 2014 for PCT/EP2013/075557.

* cited by examiner

SUBSTRATES FOR SEMICONDUCTOR DEVICES

FIELD OF INVENTION

The present invention relates to the manufacture of substrates for semiconductor devices.

BACKGROUND OF INVENTION

Optoelectronic, high power, and high frequency devices are increasingly being fabricated using wide band gap compound semiconductor materials such as gallium nitride, aluminium nitride, and silicon carbide. Such semiconductor materials are frequently grown heteroepitaxially in thin film form onto a suitable substrate which provides a template for crystal growth. Typical substrates include sapphire, silicon carbide, and silicon. For semiconductor devices such as microwave amplifier circuits, the substrate should be electrically insulating for the device to function.

A well known problem in semiconductor devices is that of heat dissipation. High temperatures often limit the performance and/or lifetime of such devices. This is a particular problem in semiconductor devices which operate at high power and/or high frequency such as microwave amplifiers, power switches and optoelectronic devices. It is therefore desirable to be able to spread any heat generated by component devices to reduce temperatures and thus improve device performance, increase device lifetime, and/or increase power density. Accordingly, it is desirable to utilize a substrate material with a high thermal conductivity to spread the heat generated by a device, lowering the power density and facilitating dissipation via a heat sink thus improving device performance, increasing lifetime, and/or enabling an increase in power density.

Diamond has unique properties as a heat spreading material, combining the highest room temperature thermal conductivity of any material, with high electrical resistivity and low dielectric loss when in an intrinsic undoped form. Thus diamond is utilized as a heat spreading substrate for semiconductor components in a number of high power density applications. The advent of large area polycrystalline diamond produced by a chemical vapour deposition (CVD) technique has expanded the applications for diamond heat spreaders via an increase in area and a reduction in cost. The majority of favourable thermal, dielectric and insulating properties of diamond are not dependent on the single crystal structure of naturally occurring or synthetic single crystal diamond material. Accordingly, polycrystalline CVD diamond wafers have been developed and are commercially available in sizes that enable them to be directly integrated with the fabrication processes of wide band gap semiconductors as a substrate material.

In light of the above, it is evident that for thin film compound semiconductor materials, an ability to integrate diamond as a carrier substrate could greatly improve thermal performance. For high power devices, the challenge is to position an active region of a device in as close proximity as possible to the heat spreading diamond substrate, since any intermediate carrier substrate material such as sapphire, silicon, or silicon carbide acts as a thermal barrier.

Compound semiconductor materials can be grown directly on a polycrystalline diamond substrate using, for example, metal organic chemical vapour deposition (MOCVD) technique. Alternatively, a thin layer of monocrystalline material such as silicon, silicon carbide, or a nitride can be disposed on a polycrystalline diamond substrate and compound semiconductor material epitaxially grown on the thin layer of monocrystalline material.

U.S. Pat. No. 7,595,507 and US 2010/0001293 disclose methods of forming semiconductor device substrates which comprise growing diamond over a monocrystalline silicon carbide layer. US 2009/0272984 also discloses a method of forming a semiconductor device substrate comprising diamond and silicon carbide. Such composite diamond-silicon carbide substrates can be used to form semiconductor devices. When forming such devices, the mono-crystalline silicon carbide layer can be used to grow a monocrystalline semiconductor layer thereover.

US 2006/0113545 discloses substrate structures comprising silicon-diamond-silicon multilayer structures. One problem with using silicon is that it offers relatively poor thermal and resistivity properties compared to silicon carbide. As such, it is desirable to make the silicon layer very thin such that the polycrystalline diamond will be disposed close to the active semiconductor components to effectively dissipate heat generated during operation.

Various prior art documents disclose methods of growing polycrystalline diamond on a substrate, reducing the thickness of the substrate to form a thin single crystal layer disposed on the polycrystalline diamond, and then growing active semiconductor layers on the thin single crystal layer. Examples of such prior art documents are briefly discussed below.

WO 2005/122284 and WO 2006/100559 disclose growth of polycrystalline diamond material on a silicon wafer followed by thinning of the silicon wafer by grinding or lapping to achieve a thin layer of silicon disposed on the polycrystalline diamond material.

EP0442304 discloses growth of polycrystalline diamond material on a silicon wafer. It is described that a thin layer of single crystal silicon carbide forms at an interface between the silicon and diamond material during growth. The document suggests that the silicon wafer can be removed to leave the thin layer of silicon carbide adhered to the polycrystalline diamond material and this thin layer of silicon carbide can be used as a growth surface for fabrication of semiconductor layers. The present inventors consider that this is incorrect as they have found that while a thin layer of silicon carbide does form at the interface between the silicon and diamond materials, this layer is amorphous and found the latter not suitable for fabricating single crystal semiconductor materials thereon by epitaxial growth.

WO2005/074013 and US2009/0272984 disclose ion implanting a buried $SiO_2$ layer into a silicon carbide wafer, growing polycrystalline diamond material on the wafer, and then removing the bulk of the silicon carbide wafer by using the implanted $SiO_2$ layer as a release layer.

U.S. Pat. No. 7,595,507 discloses ion implanting a buried $SiO_2$ layer of 100 nm to 200 nm thickness into a silicon wafer, growing polycrystalline diamond material on the wafer, and then removing the bulk of the silicon wafer using a wet etch with the thin buried $SiO_2$ layer acting as an etch stop to achieve a thin layer of silicon disposed on the polycrystalline diamond material.

U.S. Pat. No. 7,695,564 discloses a similar method which comprises ion-implantation of oxygen into a silicon wafer to form a wafer comprising a bulk silicon wafer layer of an unspecified thickness, a buried oxide layer having a thickness of approximately 100-200 nm, and a silicon overlay structure having a thickness of 50-500 nm. A polycrystalline diamond film of approximately 200 to 1500 micrometers is grown on the silicon overlayer. The bulk silicon wafer layer and the buried oxide layer are then removed to leave a composite structure comprising the polycrystalline diamond film and the silicon overlayer. A number of different methods are described for removing the silicon to form a diamond substrate with a thin silicon overlayer including: (1) selectively dissolving the buried oxide layer; (2) wet etching the bulk silicon layer followed by wet etching of the buried oxide layer; (3) lapping and polishing the bulk silicon layer followed by wet etching; or (4) lapping and polishing the bulk silicon layer followed by dry etching. The finished silicon-on-diamond substrate consists of an approximately 50 to 200 nm thick monocrystalline silicon film which is epitaxially fused to an approximately 300 to 1500 micrometer thick polycrystalline diamond substrate.

While it would seem to be simple in principle to apply any of the aforementioned techniques to thin down a substrate wafer after polycrystalline diamond growth thereon to achieve a polycrystalline diamond wafer with a thin layer of the substrate wafer adhered thereto, in practice a problem exists with known prior art techniques. Namely, as the substrate wafer is thinned down cracking occurs in the thin layer such that although a thin layer is achieved is not of high quality. This is problematic because the quality of the thin layer will affect the quality of the semiconductor layers epitaxially grown thereover to form an electronic device and this detrimentally affects device performance. In particular, the present inventors have found that as the single crystal layer adhered to the polycrystalline diamond material is thinned to a depth of less than 100 µm cracks begin to form in the thin layer of single crystal material. While it was initially thought that such cracking may be a result of mechanical damage caused by grinding, lapping, and polishing techniques, it has been found that this same problem occurs when using etching techniques such as those described above.

Another problem with prior art methods is that compound semiconductor materials grown on substrates comprising diamond wafers tend to yield a layer of compound semiconductor material which exhibits a high degree of tensile stress. The present inventors have identified that this is caused by a thermal expansion coefficient mismatch between the diamond material and the compound semiconductor material. Specifically, compound semiconductor materials such as GaN have a higher thermal expansion coefficient than diamond material between room temperature and the growth temperature at which the compound semiconductor material is deposited. Compound semiconductors such as GaN can be deposited by a number of techniques including chemical vapour deposition (CVD), molecular beam epitaxy, and sputtering and growth temperatures can be in excess of 1000° C. On cooling after CVD growth of the compound semiconductor material on a suitable substrate, the compound semiconductor layer and the substrate contract. If the substrate comprises a diamond wafer, the diamond material does not contract as much as the compound semiconductor layer would natural do as diamond material has a much lower thermal expansion coefficient than typical compound semiconductors. The diamond substrate wafer therefore generates tensile stress within the compound semiconductor layer during cooling and this can affect the performance of the layer in electronic applications. Furthermore, the tensile stress in the compound semiconductor layer can result in cracking of the layer during cooling or subsequent handling.

It is an aim of certain embodiments of the present invention to solve one or more of the aforementioned problems and provide a method of fabricating a high quality, crack free, low tensile stress layer of compound semiconductor material on a substrate comprising a wafer of polycrystalline diamond material. Advantageously, the layer of compound semiconductor material is disposed directly on the wafer of polycrystalline diamond material or positioned close thereto with one or more very thin intermediate bonding layers disposed between the compound semiconductor and diamond material. The one or more intermediate bonding layers may be formed from single crystal materials such as silicon, silicon carbide, or nitrides suitable for epitaxial growth of compound semiconductors.

SUMMARY OF INVENTION

According to a first aspect of the present invention there is provided a method of fabricating a composite semiconductor component comprising:
  (i) providing a bowed substrate comprising a wafer of synthetic diamond material having a thickness $t_d$, the bowed substrate being bowed by an amount B and comprising a convex face and a concave face;
  (ii) growing a layer of compound semiconductor material on the convex face of the bowed substrate via a chemical vapour deposition technique at a growth temperature T to form a bowed composite semiconductor component comprising the layer of compound semiconductor material of thickness $t_{sc}$ on the convex face of the bowed substrate, the compound semiconductor material having a higher average thermal expansion coefficient than the synthetic diamond material between the growth temperature T and room temperature providing a thermal expansion mismatch $\Delta T_{ec}$; and
  (iii) cooling the bowed composite semiconductor component, wherein the layer of compound semiconductor material contracts more than the wafer of synthetic diamond material during cooling due to the thermal expansion mismatch $\Delta T_{ec}$, wherein B, $t_d$, $t_{sc}$, and $\Delta T_{ec}$ are selected such that the layer of compound semiconductor material contracts on cooling by an amount which off-sets bowing in the bowed substrate thus pulling the bowed composite semiconductor component into a flat configuration, the layer of compound semiconductor material having a tensile stress after cooling of less than 500 MPa.

Accordingly to a second aspect of the present invention there is provided a composite semiconductor component comprising:
  a substrate comprising a wafer of synthetic diamond material; and
  a layer of compound semiconductor material on the substrate,
  wherein the layer of compound semiconductor material has a tensile stress of less than 500 MPa at room temperature (25° C.).

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

Figure 1:
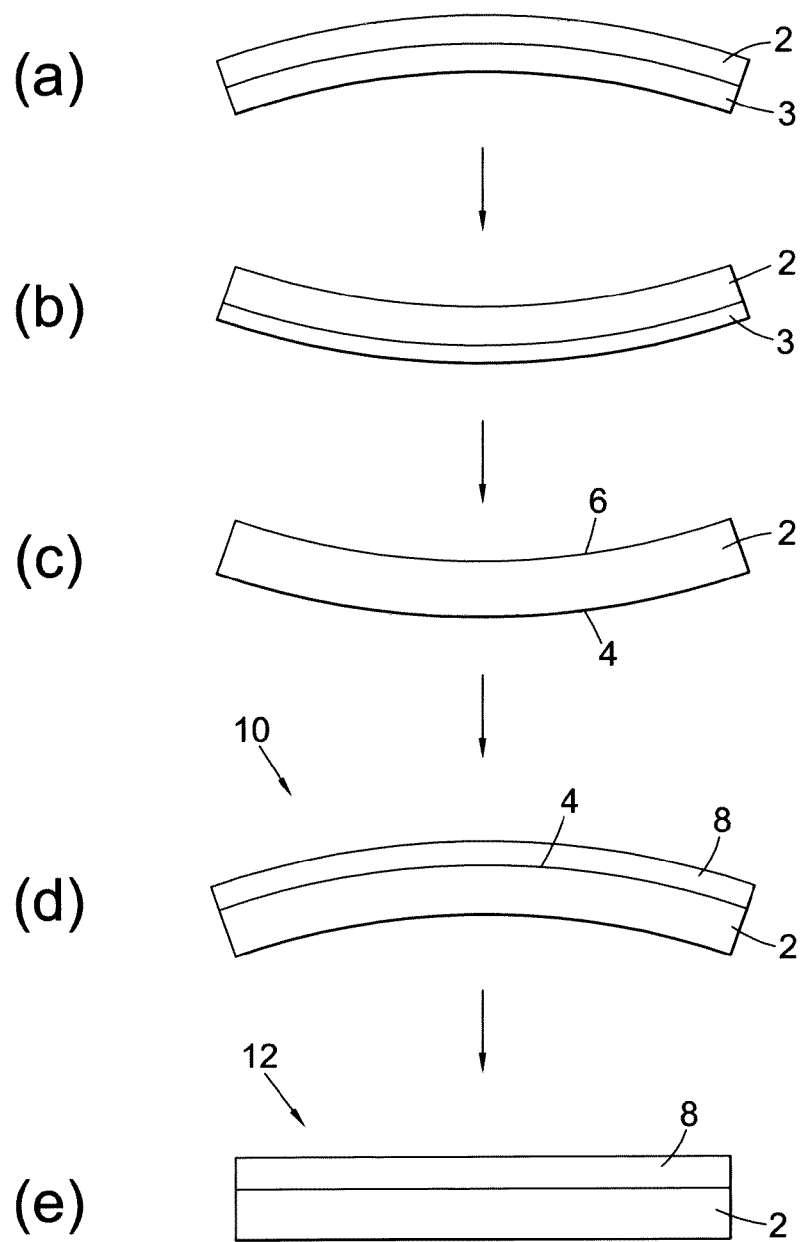
FIGS. 1(a) to 1(e) illustrate a method of fabricating a composite semiconductor component according to an embodiment of the present invention.

FIGS. 1(a) to 1(e) illustrate a method of fabricating a composite semiconductor component according to an embodiment of the present invention.

In step 1, a layer of polycrystalline CVD diamond material 2 is grown on a silicon substrate 3. On cooling after diamond growth the substrate bows due to a thermal expansion coefficient mismatch between the silicon substrate and the diamond material as illustrated in FIG. 1(a).

In step 2 the silicon substrate 3 is removed, e.g. via etching. During processing to thin and remove the silicon substrate 3 the stress in the silicon increases and as the layer of silicon reaches a thickness of approximately 100 µm the composite tends to flip to bow the other way such that the thin silicon layer is placed in tension as illustrated in FIG. 1(b).

In step 3, further processing can remove the remaining silicon leaving a bowed wafer of CVD diamond material as illustrated in FIG. 1(c).

A key feature is that the wafer of polycrystalline CVD synthetic diamond material 2 is bowed such that it comprises a convex face 4 and a concave face 6. The magnitude of bowing B may be measured as the height of the mid-point of the substrate relative to a plane defined by the edge of the substrate. Alternatively, the magnitude of bowing B may be measured as the radius of curvature of the substrate.

The magnitude of bowing will depend on the thickness of the original silicon substrate and the thickness of the polycrystalline CVD diamond layer grown thereon. Furthermore, using different substrate compositions will vary the thermal expansion coefficient mismatch and rigidity of the system. As such, the diamond growth process can be tailored to generate a range of bowing magnitudes. Generally, the convex bow of the substrate is larger for thinner wafers of polycrystalline CVD diamond.

In step 4, a layer of compound semiconductor material 8 is grown on the convex face 4 of the bowed polycrystalline CVD diamond substrate 2 via a chemical vapour deposition technique at a growth temperature T (typically in excess of 1000° C.) to form a bowed composite semiconductor component 10 as illustrated in FIG. 1(d). The bowed composite semiconductor component 10 comprises the layer of compound semiconductor material 8 on the convex face 4 of the bowed polycrystalline CVD diamond substrate 2.

In step 5, the bowed composite semiconductor component 10 is cooled. The compound semiconductor material has a higher average thermal expansion coefficient than the polycrystalline CVD synthetic diamond material between the growth temperature T and room temperature providing a thermal expansion mismatch $\Delta T_{ec}$. On cooling, the layer of compound semiconductor material contracts more than the wafer of polycrystalline CVD synthetic diamond material due to the thermal expansion mismatch $\Delta T_{ec}$. Contraction of the layer of compound semiconductor material pulls the polycrystalline CVD synthetic diamond material into a flat configuration 12 as illustrated in FIG. 1(e). Movement of the polycrystalline CVD synthetic diamond material from a bowed state to a flat state allows the compound semiconductor material to contract thus avoiding a large tensile stress being introduced into the compound semiconductor layer during cooling. Furthermore, if a suitable combination of materials and layer thicknesses is selected the layer of compound semiconductor material contracts on cooling by an amount which off-sets bowing in the substrate thus pulling the bowed composite semiconductor component into a flat configuration with the layer of compound semiconductor material having a tensile stress after cooling of less than 500 MPa, more preferably less than 450 MPa, 400 MPa, 350 MPa, 300 MPa, 250 MPa, or 210 MPa at room temperature (25° C.). A flat, crack-free, low strain compound semiconductor layer on a substrate comprising a wafer of polycrystalline CVD synthetic diamond material is thus produced.

As indicated above, a suitable combination of materials and layer thicknesses must be selected such that the layer of compound semiconductor material contracts on cooling by an amount which off-sets bowing in the substrate to yield a flat, crack-free, low strain compound semiconductor layer on a substrate comprising a wafer of polycrystalline CVD synthetic diamond material. For example, if the diamond layer is too thick or the compound semiconductor layer is too thin then the thermally induced compressive stress generate in the diamond wafer by contraction of the compound semiconductor layer will be insufficient to pull the bowed substrate into a flat configuration and on cooling tensile stress will build up in the overlying semiconductor layer. Similarly, if the substrate is too bowed, or alternatively insufficiently bowed, then a flat, crack-free, low strain compound semiconductor layer will not be achieved after cooling. The amount of bowing B required will be dependent on the thickness of the diamond and semiconductor layers $t_d$, $t_{sc}$, and the magnitude of the thermal expansion coefficient mismatch $\Delta T_{ec}$. As such, the parameters B, $t_d$, $t_{sc}$, and $\Delta T_{ec}$ are all interrelated with the magnitude of any one of the parameters being dependent on the magnitude of the other parameters. However, for a given compound semiconductor material the thermal expansion coefficient mismatch $\Delta T_{ec}$ will be fixed. A range of bow magnitudes and layer thicknesses may then be tested to achieve the desired result.

In the embodiment illustrated in FIG. 1 the substrate for compound semiconductor growth is formed of a wafer of polycrystalline diamond material with the compound semiconductor material deposited directly thereon. However, in an alternative arrangement the bowed substrate comprises a layer of single crystal material on the convex face of the bowed substrate, the layer of compound semiconductor material being grown on said layer of single crystal material. Advantageously, the layer of compound semiconductor material is disposed close to the diamond material in order to achieve efficient heat spreading, e.g. a spacing between the compound semiconductor material and the diamond material being no more than 5 µm, 3 µm, 2 µm, or 1 µm. As such, one or more intermediate bonding layers disposed between the compound semiconductor and diamond material should be made very thin, i.e., no more than 5 µm, 3 µm, 2 µm, or 1 µm in total thickness. The one or more intermediate bonding layers may be formed from single crystal materials such as silicon, silicon carbide, or nitrides suitable for epitaxial growth of compound semiconductors.

FIGS. 2(a) to 2(e) illustrate a method of fabricating a composite semiconductor component according to another embodiment of the present invention in which a thin layer of silicon is provided between the compound semiconductor layer and the wafer of polycrystalline CVD diamond material.

In step 1 a diamond wafer 20 is grown on a silicon-on-insulator (SOI) substrate 22. The SOI substrate 22 comprises a thin layer of silicon 24, a buried $SiO_2$ layer 26, and a thicker supporting layer of silicon 28. On cooling after diamond growth the substrate bows due to a thermal expansion coefficient mismatch between the silicon substrate and the diamond material as illustrated in FIG. 2(*a*).

In step 2 the supporting layer of silicon 28 is thinned, e.g. via etching. During processing to thin the silicon wafer the stress in the silicon increases and as the layer of silicon reaches a thickness of approximately 100 μm the composite tends to flip to bow the other way such that the thin silicon layer 24 is placed in tension as illustrated in FIG. 2(*b*). In step 3, further processing can remove the remaining silicon and the $SiO_2$ layer thus leaving a thin silicon layer 24 adhered to the CVD diamond material 20 without any significant cracking as illustrated in FIG. 2(*c*).

In step 4, the bowed diamond-silicon substrate can then be used as a substrate for compound semiconductor growth in a similar manner to that illustrated in FIG. 1. FIG. 2(*d*) illustrates the growth of a compound semiconductor layer 30 on the thin silicon layer 24. In step 5, the composite diamond-silicon-compound semiconductor component is cooling. As previously described, the thermal expansion coefficient mismatch between the compound semiconductor layer 30 and the diamond wafer 20 causes the structure to be pulled into a flat configuration if a suitable combination of layer thicknesses and starting strain in the diamond wafer is selected as illustrated in FIG. 2(*e*).

Figure 2:
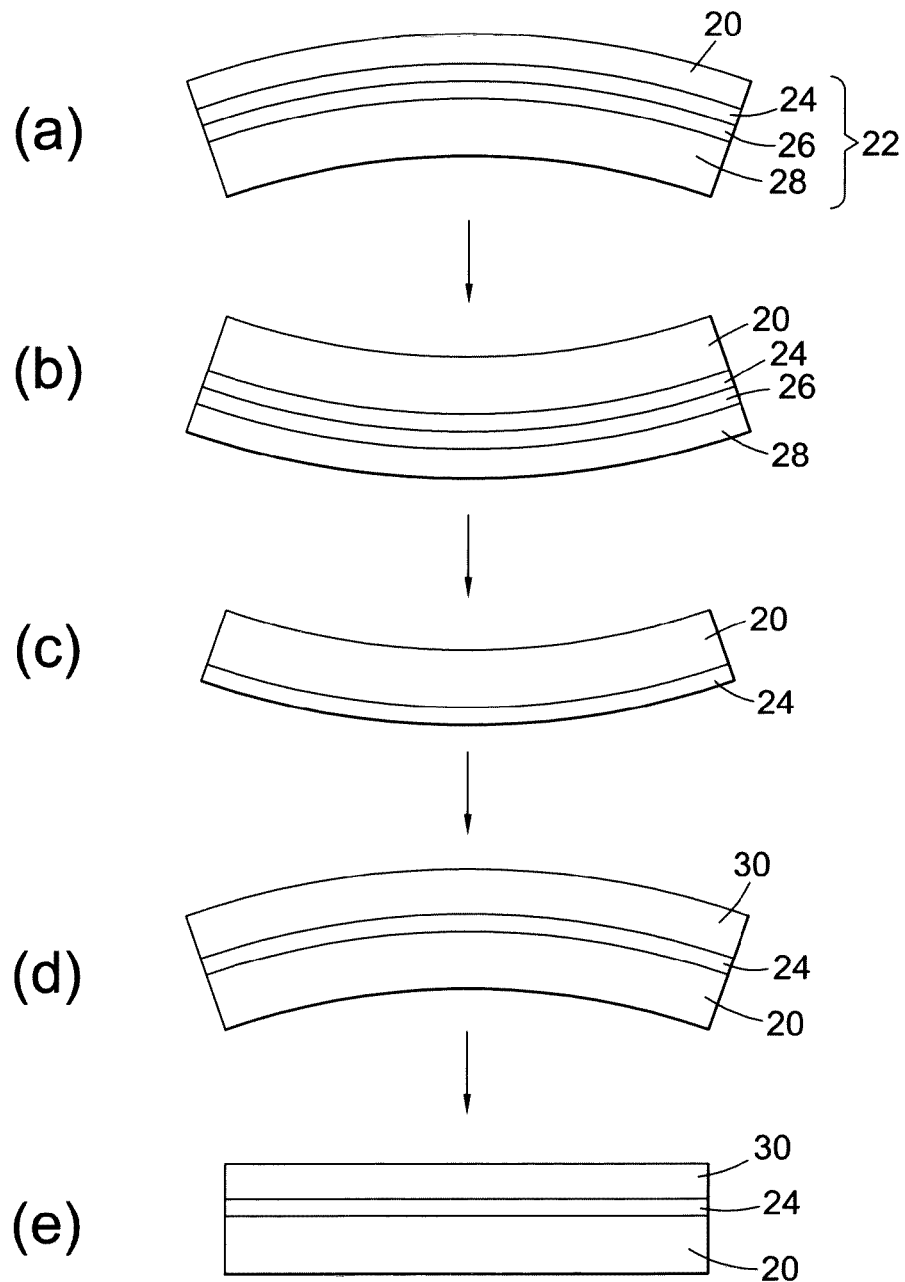
FIGS. 2(a) to 2(e) illustrate a method of fabricating a composite semiconductor component according to another embodiment of the present invention.

As described in the background section, one problem with fabricating a thin silicon layer on a diamond carrier wafer is that as the silicon is thinned down as illustrated in FIGS. 2(*b*) and 2(*c*), cracking can occur in the thin layer such that although a thin layer is achieved it is not of high quality. The present inventors believe that the aforementioned problem of cracking of the silicon material (or other suitable single crystal layers such as carbides and nitrides) as the material is thinned to less than 100 μm is a result of thermally induced stress generated by the CVD diamond growth process and caused by a mismatch in thermal expansion coefficient between the polycrystalline diamond material and the single crystal wafer material. For example, silicon has a much higher thermal expansion coefficient than diamond (at least at temperatures below about 700° C.) such that on cooling after CVD diamond growth the silicon wafer contracts more than the polycrystalline diamond causing bowing as illustrated in FIG. 2(*a*). During processing to thin the silicon wafer the stress in the silicon increases and as the layer of silicon reaches a thickness in a range from half the thickness of the diamond wafer to twice the thickness of the diamond wafer, e.g. approximately 100 μm, the composite tends to flip to bow the other way such that the thin silicon layer is placed in tension as illustrated in FIG. 2(*b*). This tension tends to cause the thin silicon layer to crack.

The aforementioned problem can be partially addressed by controlling the temperature of the growth surface of the polycrystalline CVD diamond layer during growth such that a temperature difference at a growth surface between an edge and a centre point thereof is maintained to be no more than 80° C., 60° C., 40° C., 20° C., 10° C., 5° C., or 1° C. Such temperature control can aid in alleviate problems of thermally induced stresses leading to cracking.

The present inventors have also found that the mechanical stiffness of the substrate wafer must be sufficiently large to alleviate the problem of bowing and cracking of the silicon material during processing of the substrate wafer after CVD diamond growth thereon. The present inventors have found that the required level of mechanical stiffness can be achieved by providing a substrate wafer which is relatively thick (compared with its lateral width). Otherwise, even if the temperature across the growth surface is controlled to vary by no more than 80° C., plastic deformation of the substrate wafer still occurs. For example, the aspect ratio of the substrate wafer, defined by a ratio of thickness to width, should be no less than 0.25/100, 0.30/100, 0.40/100, 0.50/100, 0.60/100, 0.70/100, 0.80/100, 0.90/100, or 1.0/100. However, if the substrate wafer becomes too thick then this adds significant expense. As such, in practice the substrate wafer has an aspect ratio no more than 10/100, 8/100, 6/100, 4/100, or 2/100.

Despite the above modifications, cracking of the thin silicon layer of material during thinning of the substrate wafer can still be problematic. The present inventors have found that the thin silicon layer can be made more resistant to cracking under the tensioning mechanism illustrated in FIG. 2(*b*) if a relatively thick layer of $SiO_2$ is introduced into the silicon wafer prior to CVD diamond growth thereon. While not being bound by theory it is postulated that this reduction in cracking may be due to the relatively thick $SiO_2$ layer functioning as a crack stop and/or the relatively thick $SiO_2$ layer functioning to pre-compress the thin overlying layer of single crystal silicon material during CVD diamond growth due to its lower thermal expansion coefficient such that it is more resistant to tensile stress induced during processing of the silicon wafer to achieve a thin layer. In either case, it is important that the $SiO_2$ layer should have a thickness sufficient to fulfil either of these functions.

As shown in FIG. 2(*a*) bowing of the substrate after CVD diamond growth thereon can still occur as described previously. Furthermore, as described previously, during processing to thin the silicon wafer the stress in the silicon increases and as the layer of silicon reaches a thickness in a range from half the thickness of the diamond wafer to twice the thickness of the diamond wafer, e.g. approximately 100 μm, the composite tends to flip to bow the other way such that the thin silicon layer is placed in tension as illustrated in FIG. 2(*b*). However, even if cracks form in the silicon handle wafer these cracks are prevented from propagating into the thin silicon layer adjacent the CVD diamond material by the relatively thick $SiO_2$ layer. Further processing can remove the remaining silicon and the $SiO_2$ layer thus leaving a thin silicon layer adhered to the CVD diamond material without any significant cracking. As illustrated in FIG. 2(*c*).

Figure 3:
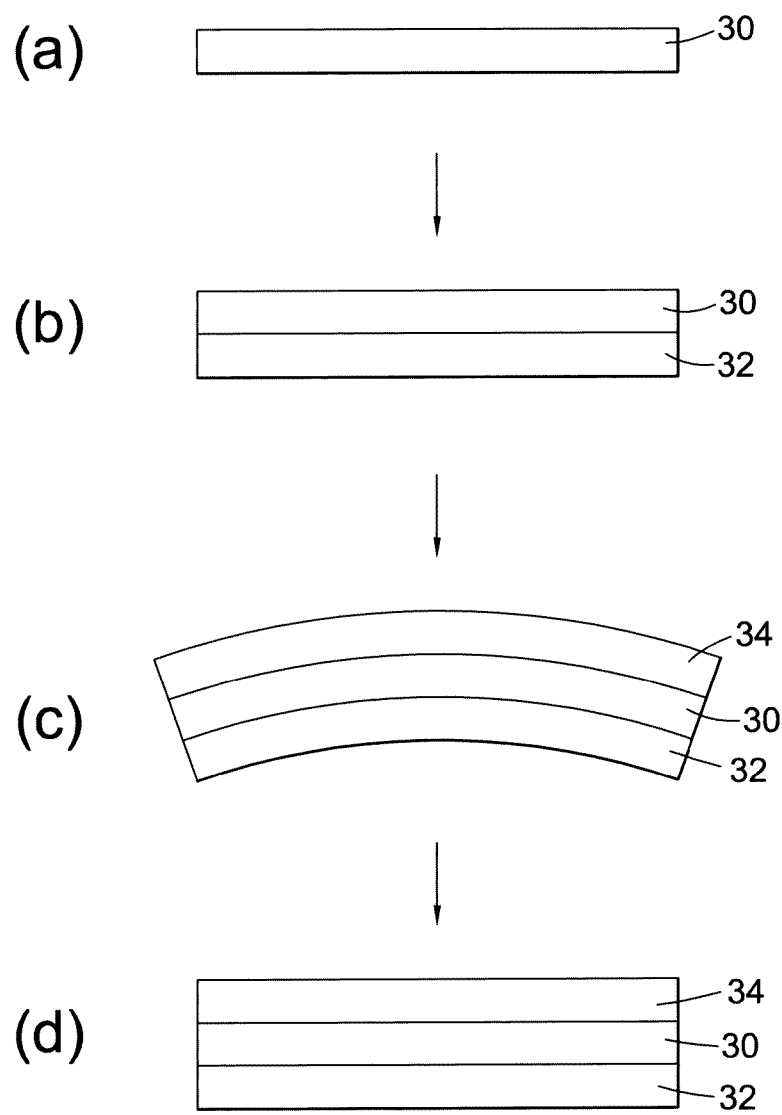
FIGS. 3(a) to 3(d) illustrate a method of fabricating a composite semiconductor component according to another embodiment of the present invention.

FIGS. 3(*a*) to 3(*d*) illustrate a method of fabricating a composite semiconductor component according to yet another embodiment of the present invention.

In step 1, a flat polycrystalline CVD diamond wafer 30 is provided as illustrated in FIG. 3(*a*). Such a polycrystalline CVD diamond wafer 30 may be fabricated by CVD diamond growth on a refractory metal substrate.

In step 2, a material 32 having a thermal expansion coefficient lower than that of the polycrystalline CVD diamond wafer (such as $SiO_2$) is adhered to one side of the polycrystalline CVD diamond wafer as illustrated in FIG. 3(*b*).

In step 3, a compound semiconductor layer 34 is grown on an opposite side of the polycrystalline CVD diamond wafer 30 to the layer of $SiO_2$ 32. As the composite diamond-$SiO_2$ substrate is raised to the growth temperature of the compound semiconductor layer the composite diamond-$SiO_2$ substrate bows due to the thermal expansion coefficient mismatch between the diamond and $SiO_2$. As the $SiO_2$ has a lower thermal expansion coefficient than diamond then the diamond 30 forms a convex growth surface on which the compound semiconductor 34 is grown as illustrated in FIG. 3(*c*).

In step 4, on cooling, the compound semiconductor layer 34 contracts more than the diamond 30 and the diamond 30 contracts more than the SiO$_2$ layer 32 thus pulling the composite structure back to a flat configuration in a similar manner to previous embodiments and as illustrated in FIG. 3(d).

FIGS. 1 to 3 have illustrated three different ways of implementing embodiments of the present invention. However, other alternatives may also be envisaged. For example, the polycrystalline CVD diamond wafer may be mechanically bowed prior to growth of a compound semiconductor thereon. Alternatively, the low thermal expansion coefficient material 32 shown in FIG. 3 may be combined with the approaches illustrated in FIG. 1 or 2 to control bowing of the substrate prior to compound semiconductor growth and straightening on cooling after compound semiconductor growth. Alternatively still, a plurality of layers having different thermal expansion coefficients may be adhered to the polycrystalline CVD diamond wafer to control bowing and straightening. The key feature of all these embodiments is that on cooling after compound semiconductor growth the structure allows the compound semiconductor layer to contract without building up excessive tensile stress.

Advantageously, embodiments of the present invention will utilize diamond material may have a thermal conductivity equal to or greater than 600 Wm$^{-1}$K$^{-1}$, 800 Wm$^{-1}$K$^{-1}$, 1000 Wm$^{-1}$K$^{-1}$, 1200 Wm$^{-1}$K$^{-1}$, or 1400 Wm$^{-1}$K$^{-1}$. Such high quality diamond material can be fabricated using a microwave plasma method. As such, embodiments of the present invention provide high quality diamond material combined with high quality, low strain compound semiconductor material in close proximity resulting in a better performance semiconductor device.

Suitable wafers of polycrystalline CVD diamond material can have a diameter in a range: 20 mm to 300 mm; 20 mm to 250 mm; 20 mm to 200 mm; 20 mm to 160 mm; 40 mm to 140 mm; 60 mm to 120 mm; 80 mm to 120 mm; or 90 mm to 110 mm. As previously indicated, a more pronounced bowing can be achieved by fabricating thin wafers of polycrystalline CVD diamond. As such, the wafers of polycrystalline CVD diamond material may be grown to a thickness in the range: 25 µm to 450 µm; 25 µm to 400 µm; 25 µm to 350 µm; 25 µm to 300 µm; 25 µm to 250 µm; 25 µm to 200 µm; 25 µm to 150 µm; 40 µm to 130 µm; or 50 µm to 100 µm. The wafer of synthetic diamond material may be formed of a free-standing synthetic diamond wafer or a wafer which comprises a layer of synthetic diamond material on a support substrate.

While previous embodiments have been described in relation to polycrystalline CVD diamond wafers, it is also envisaged that the methodology of the present invention can also be applied equally well to single crystal diamond wafers, e.g. single crystal CVD diamond wafers. It has recently been demonstrated that compound semiconductors such as GaN can be grown directly on both polycrystalline CVD diamond wafers and single crystal diamond wafers. The same thermally induced tensile stress problem will equally exists for growth of compound semiconductor material on substrates comprising single crystal diamond material. As such, bowing a single crystal diamond wafer as previously described will alleviate this problem in an analogous manner to that described for polycrystalline CVD diamond wafers.

The layer of single crystal compound semiconductor may have a charge mobility no less than 1000 cm$^2$V$^{-1}$s$^{-1}$, 1200 cm$^2$V$^{-1}$s$^{-1}$, 1400 cm$^2$V$^{-1}$s$^{-1}$, 1600 cm$^2$V$^{-1}$s$^{-1}$, 1800 cm$^2$V$^{-1}$s$^{-1}$, or 2000 cm$^2$V$^{-1}$s$^{-1}$. While such charge mobilities of compound semiconductor layers have previously been achieved on non-diamond substrates and may be achieved on diamond substrates when the semiconductor layer is not in good thermal contact with the diamond substrate layer, the combination of a relatively thick, high thermal conductivity diamond layer in combination with a high quality, low strain compound semiconductor layer, with both layers disposed in very close proximity to provide good thermal contact has proved difficult to date for the reasons explained in this specification.

EXAMPLES

Three different substrates have been fabricated, each comprising a polycrystalline CVD diamond wafer with a thin layer of single crystal {111} oriented silicon disposed thereon. The first substrate was fabricated to have a highly convex silicon growth surface, the second substrate was fabricated to have a slightly convex (nearly flat configuration), whereas the third substrate was fabricated to have a slightly concave silicon growth surface. All three substrates were approximately 50 to 60 µm thick, the silicon layer of each substrate being approximately 2 µm thick. The thin silicon layer of each substrate was formed by etching back a thicker substrate in a similar manner to that illustrated with reference to FIG. 2. The etching provided a hydrogen terminated silicon growth surface which is ideal for MOCVD growth of semiconductor material thereon.

Compound semiconductor layers were grown on the silicon growth surface of each of the three diamond-silicon substrates. The compound semiconductor layers included a stacked layer structure comprising AlN, AlGaN, and GaN layers.

After fabrication, the composite structures were analysed using a known micro-Raman technique to measure the tensile stress in the GaN layer of each of the three components. The slightly concave substrate and the nearly flat substrate resulted in a relatively high tensile stress in the GaN layer while the highly convex substrate resulted in a low tensile stress in the GaN layer of below 210 MPa.

While this invention has been particularly shown and described with reference to preferred embodiments, it will be understood to those skilled in the art that various changes in form and detail may be made without departing from the scope of the invention as defined by the appendant claims.

The work leading to this invention has received funding from the [European Community's] [European Atomic Energy Community's] Seventh Framework Programme ([FP7/2007-2013] [FP7/2007-2011]) under grant agreement n° [214610].

The invention claimed is:

1. A method of fabricating a composite semiconductor component, the method comprising:
   (i) disposing a synthetic diamond layer on a wafer and cooling the synthetic diamond layer so that the synthetic diamond layer and wafer form a first bowed substrate;
   (ii) removing at least a portion of the wafer of the first bowed substrate so that the first bowed substrate flips to bow in an opposite direction to thereby form a second bowed substrate, the second bowed substrate has a convex face and a concave face;
   (iii) growing a layer of compound semiconductor material on the convex face of the second bowed substrate at a growth temperature to form a bowed composite semiconductor component, the compound semiconductor material having a higher average thermal expansion coefficient than the synthetic diamond material between the growth temperature and room temperature; and (iv) cooling the bowed composite semiconductor component, wherein the layer of compound semiconductor material contracts more than the synthetic diamond layer during cooling due to a thermal expansion mismatch between the compound semiconductor material and a material of the synthetic diamond layer and wherein the layer of compound semiconductor material contracts on cooling by an amount which off-sets bowing in the second bowed substrate thus pulling the bowed composite semiconductor component into a flat configuration.

2. A method according to claim 1, wherein, after step (iv), the layer of compound semiconductor material has a tensile stress of less than 500 MPa.

3. A method according to claim 1, wherein a thickness of the synthetic diamond layer is in a range of 25 µm to 450 µm.

4. A method according to claim 1, wherein the wafer includes a silicon layer and the step of removing at least a portion of the wafer includes removing the silicon layer.

5. A method according to claim 1, wherein the wafer further includes a first silicon layer, a silicon dioxide layer and a second silicon layer and the step of removing the at least a portion of the wafer includes removing the first silicon layer.

* * * * *